United States Patent
Fujimoto

(10) Patent No.: US 8,008,973 B2
(45) Date of Patent: Aug. 30, 2011

(54) AMPLIFIER FOR AMPLIFYING A HIGH-FREQUENCY SIGNAL

(75) Inventor: Ryuichi Fujimoto, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/719,253

(22) Filed: Mar. 8, 2010

(65) Prior Publication Data

US 2011/0068871 A1 Mar. 24, 2011

(30) Foreign Application Priority Data

Sep. 18, 2009 (JP) ................................. 2009-217599

(51) Int. Cl.
*H03G 3/12* (2006.01)
(52) U.S. Cl. ........................... 330/283; 330/305; 330/51
(58) Field of Classification Search .................. 330/283, 330/305, 51
See application file for complete search history.

(56) References Cited

U.S. PATENT DOCUMENTS

| | | | |
|---|---|---|---|
| 6,882,223 B2 * | 4/2005 | Hsu et al. .................... | 330/252 |
| 7,098,737 B2 | 8/2006 | Fujimoto et al. | |
| 7,110,742 B2 * | 9/2006 | Roufoogaran ............... | 455/333 |
| 7,190,239 B2 | 3/2007 | Fujimoto et al. | |
| 7,298,205 B2 * | 11/2007 | Nakatani et al. ............ | 330/107 |
| 7,414,481 B2 * | 8/2008 | Li et al. ....................... | 330/311 |
| 7,417,501 B2 | 8/2008 | Fujimoto et al. | |
| 7,495,515 B1 * | 2/2009 | Branch et al. .............. | 330/305 |
| 7,592,873 B2 * | 9/2009 | Satoh et al. ................. | 330/305 |
| 2011/0018635 A1 * | 1/2011 | Tasic et al. .................. | 330/277 |

FOREIGN PATENT DOCUMENTS

JP 2009-010826 1/2009

* cited by examiner

*Primary Examiner* — Patricia Nguyen
(74) *Attorney, Agent, or Firm* — Turocy & Watson, LLP

(57) ABSTRACT

A transistor is provided to amplify a high frequency signal. A gate/base of the transistor receives the high frequency input signal. A variable capacitor is connected between the gate and a source/between the base and an emitter of the transistor. A variable inductor is connected with the source/the emitter of the transistor.

15 Claims, 6 Drawing Sheets

AMPLIFIER FOR AMPLIFYING A HIGH-FREQUENCY SIGNAL

CROSS REFERENCE TO RELATED APPLICATION

This application is based upon and claims the benefit of priority from the prior Japanese Patent Application No. 2009-217599, filed on Sep. 18, 2009, the entire contents of which are incorporated herein by reference.

FIELD OF THE INVENTION

The invention relates to an amplifier to amplify a high-frequency signal.

DESCRIPTION OF THE BACKGROUND

An amplifier is used in a communication system. Such an amplifier needs tuning in order to operate in good condition in multiple frequency bands. Conventionally, for the purpose of tuning an amplifier for amplifying a high-frequency signal, impedance matching is preformed by changing transconductance of a field effect transistor constituting the amplifier, or by using variable capacitors.

Such change of the transconductance of the field effect transistor or use of the variable capacitors, which performs impedance matching, changes gain of the amplifier to a large extent.

Japanese Patent Application Publication No. 2009-10826 discloses another technique to amplifier operate an amplifier in multiple frequency bands. According to the technique, the amplifier is provided with a degeneration portion including multiple inductors connected to multiple amplifying elements respectively.

The technique disclosed in the Patent Publication needs multiple high-frequency signal input terminals corresponding to the respective frequency bands, even though the multiple inductors of the degeneration portion are formed in a smallest possible occupation area. As a result, the technique can not achieve size reduction of the amplifier.

SUMMARY OF THE INVENTION

An aspect of the present invention provides an amplifier, which includes a transistor to amplify a high frequency signal, a gate/base of the transistor receiving the high frequency input signal, a variable capacitor connected between the gate and a source/between the base and an emitter of the transistor, and a variable inductor connected with the source/the emitter of the transistor.

Another aspect of the present invention provides an amplifier having a high frequency signal input terminal and a high frequency signal output terminal, which includes a plurality of transistors to amplify a high frequency signal, gates/bases of the transistors being connected with the high frequency signal input terminal, drains/collectors of the transistors being connected with the high frequency signal output terminal, a plurality of variable capacitors connected between the gates and sources/between the bases and emitters of the transistors respectively, a plurality inductors connected with the sources/the emitters of the transistors and mutually coupled with each other electromagnetically, and an On/OFF control circuit to control the potentials of the gates/the bases of the transistors respectively, the On/OFF control circuit turns on/off the transistors selectively.

Further another aspect of the present invention provides an amplifier having a high frequency signal input terminal and a high frequency signal output terminal, which includes a plurality of transistors to amplify a high frequency signal, gates/bases of the transistors being connected with the high frequency signal input terminal, drains/collectors of the transistors being connected with the high frequency signal output terminal, a plurality of variable capacitors connected between the gates and sources/between the bases and emitters of the transistors respectively, a plurality inductors connected with the sources/the emitters of the transistors and mutually coupled with each other electromagnetically, and a bias control circuit to control the bias potentials of the gates/the bases of the transistors respectively, the bias control circuit regulate currents flowing through the transistors respectively.

DETAILED DESCRIPTION OF THE INVENTION

Figure 1:
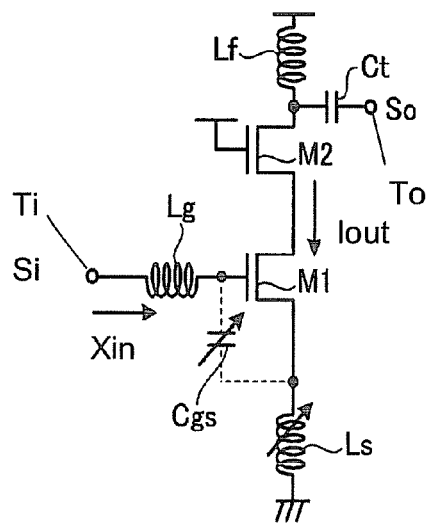
FIG. 1 is a circuit diagram showing a schematic configuration of an amplifier according to a first embodiment of the invention.

Hereinafter, embodiments of the invention will be described with reference to the drawings. In the drawings, the same reference numerals designate the same or similar portions, respectively.

A first embodiment of the invention will be described referring to FIG. 1. FIG. 1 is a circuit diagram showing a schematic configuration of the amplifier according to the first embodiment.

As shown in FIG. 1, the amplifier is provided with a field effect transistor M1 to amplify a high-frequency signal, a variable capacitor Cgs, and a variable inductor Ls. An end of an inductor Lg is connected to the gate of the field effect transistor M1. The other end of the inductor Lg is connected to an input terminal Ti. The variable capacitor Cgs is connected between the gate and the source of the field effect transistor M1. The variable inductor Ls is connected to the source of the field effect transistor M1.

A value of the variable capacitor Cgs and a value of the variable inductor Ls can be set so as to perform impedance matching at each selected frequency.

A power supply potential is connected to the drain of the field effect transistor M1 sequentially through a field effect transistor M2 and an inductor Lf. The power supply potential is connected to the gate of the field effect transistor M2. An end of the capacitor Ct is connected to the drain of the field effect transistor M2. The other end of the capacitor Ct is connected to an output terminal To.

An input signal Si is inputted into the gate of the field effect transistor M1 through the inductor Lg. The input signal Si is amplified by the field effect transistor M1, while frequency band is selected for use by the variable capacitor Cgs and the variable inductor Ls. The signal amplified in the field effect transistor M1 passes the field effect transistor M2, and a direct-current component of the amplified signal is cut off by the capacitor Ct. The resultant signal is outputted from a terminal To, as an output signal So.

The input impedance $Z_{in}$ of the amplifier according to the embodiment can be expressed with the following equation (1).

$$Z_{in}=g_m L_s/C_{gs}+j(\omega L_g+\omega L_s-1/\omega C_{gs}) \quad (1)$$

In the equation (1), $g_m$ denotes the transconductance of the field effect transistor M1, $L_g$ denotes a value of the inductance of the inductor Lg, $L_s$ denotes a value of the inductance of the variable inductor Ls, and $C_{gs}$ denotes a value of the capacitance of the variable capacitor Cgs.

For the purpose of achieving impedance matching at each selected frequency, the value of the variable capacitor Cgs is set in a way that the imaginary part of the equation (1) is equal to 0 (zero). The value of the variable inductor Ls is set in a way that the real part of the equation (1) is equal to 50Ω. Thus, when the selected frequency is a high frequency, the value of the variable capacitor Cgs and the value of the variable inductor Ls can be adjusted to be smaller than those when the selected frequency is a low frequency.

Because the embodiment uses the variable capacitor Cgs and the variable inductor Ls, the embodiment does not need to change the transconductance of the field effect transistor M1, which is otherwise required to achieve the impedance matching at each selected frequency.

The embodiment enables the drain current Tout of the field effect transistor M1 to be constant, and accordingly makes it possible to tune the amplifier in order that the amplifier can operate in good condition in multiple frequency bands while suppressing change in gain.

Figure 2:
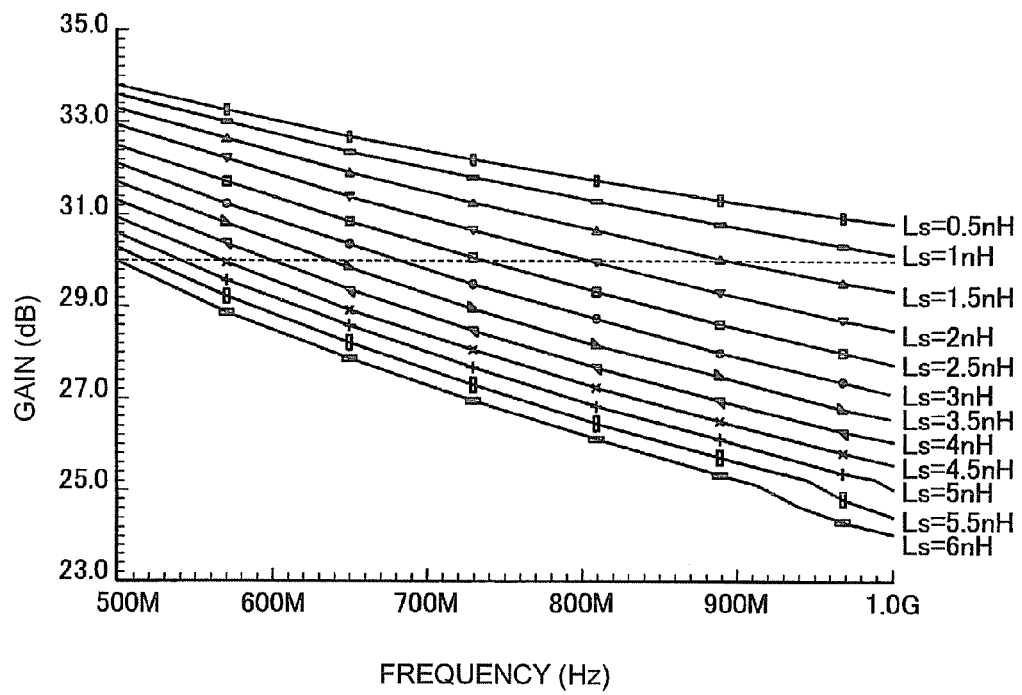
FIG. 2 is a diagram showing characteristics of maximum available gain with respect to frequency, which are observed when a value of an inductor Ls shown in FIG. 1 is changed.

FIG. 2 is a diagram showing how maximum available gain depends on frequency when the value of the variable inductor Ls shown in FIG. 1 is changed.

It is seen from FIG. 2 that the value of the variable inductor Ls should be set at approximately 6 nil desirably to keep the gain at 30 dB, for instance, when the frequency is around 500 MHz. It is also seen from FIG. 2 that the value of the variable inductor Ls should be set at approximately 1 nH desirably to keep the gain at 30 dB, for instance, when the frequency is around 1 GHz.

Figure 3:
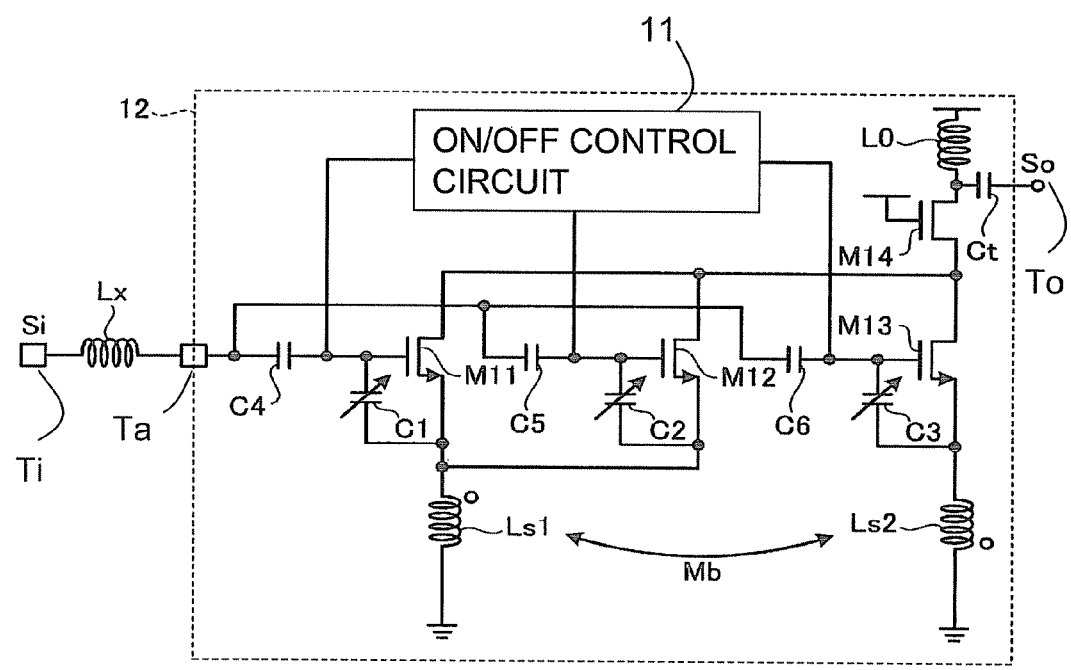
FIG. 3 is a circuit diagram showing a schematic configuration of an amplifier according to a second embodiment of the invention.

FIG. 3 is a circuit diagram showing a schematic configuration of an amplifier according to a second embodiment of the invention.

As shown in FIG. 3, the amplifier is provided with field effect transistors M11 to M13 to amplify a high-frequency signal, variable capacitor C1 to C3, inductors Ls1, Ls2, and an On/OFF control circuit 11. The On/OFF control circuit 11 controls gate potentials of the respective field effect transistors M11 to M13 individually. The On/OFF control circuit 11 controls on and off of each of the field effect transistors M11 to M13 individually. The On/OFF control circuit 11 is capable of controlling on and off of each of the field effect transistors M11 to M13 in a way that impedance matching is achieved at each selected frequency.

The gates of the field effect transistors M11 to M13 are connected to a high-frequency signal input terminal Ta through capacitors C4 to C5, respectively. An end of an inductor Lx is connected to the high-frequency signal input terminal Ta. The other end of the inductor Lx is connected to a high-frequency signal input terminal Ti. The On/OFF control circuit 11 is connected to the gates of the field effect transistors M11 to M13. The variable capacitor C1 is connected between the gate and the source of the field effect transistor M11. The variable capacitor C2 is connected between the gate and the source of the field effect transistor M12. The variable capacitor C3 is connected between the gate and the source of the field effect transistor M13.

The inductor Ls1 is connected to the sources of the field effect transistors M11, M12. The inductor Ls2 is connected to the source of the field effect transistor M13. The inductors Ls1, Ls2 are mutually electromagnetically coupled to each other with a mutual inductance Mb. The inductors Ls1, Ls2 can operate as a variable inductor by mutually strengthening and weakening the magnetic flux, which is produced from the inductors Ls1, Ls2, depending on the currents flowing in the inductors Ls1, Ls2.

The magnitudes of the currents which flow in the inductors Ls1, Ls2 can be changed by turning on and off the field effect transistors M11 to M13. Specifically, in a case where the field effect transistors M11, M12 are turned on and the field effect transistor M13 is turned off, a bias current and a signal current flow in the inductor Ls1. In this case, however, neither a bias current nor a signal current flows in the inductor Ls2. As a result, only the inductor Ls1, in which the signal current flows, functions as a degeneration inductor of the amplifier.

On the other hand, in a case where the field effect transistors M11, M13 are turned on and the field effect transistor M12 is turned off, a bias current and a signal current flow in each of the inductors Ls1, Ls2. Because the signal currents flow in the two inductors Ls1, Ls2 mutually coupled to each other, the magnetic fields, which are produced in the inductors Ls1, Ls2, are offset each other. Accordingly, the inductors Ls1, Ls2 seem to be small inductors equivalently, as a whole. In addition, the inductors Ls1, Ls2 function as degeneration inductors equivalently, which are connected together in parallel. The inductors Ls1, Ls2 further function as small degeneration inductors as a whole. When the field effect transistors M11 to M13 are turned on and off, it is possible to change degeneration inductances equivalently.

A power supply potential is connected to the drains of the respective field effect transistors M11 to M13 sequentially through a field effect transistor M14 and an inductor L0. The power supply potential is connected to the gate of the field effect transistor M14. The drain of the field effect transistor M14 is connected to the output terminal So through the capacitor Ct.

The field effect transistors M11 to M13, the variable capacitors C1 to C3, the inductors Ls1, Ls2, the capacitors C4 to C6, and the On/OFF control circuit 11 can be formed in an IC chip 12. The inductor Lx may be used as an external part which is connected to the terminal Ta of the IC chip 12.

The input signal Si, which is inputted through the inductor Lx, is inputted into the gates of the field effect transistors M11 to M13 respectively through the capacitors C4 to C6. The On/OFF control circuit 11 controls the on and off of each of the field effect transistors M11 to M13 depending on each selected frequency. Thus, the On/OFF control circuit 11 can control the currents which flow in the inductors Ls1, Ls2 respectively, and accordingly, the On/OFF control circuit 11 can change the inductances of the respective inductors Ls1, Ls2.

The input signal Si is amplified by the field electric transistors M11 to M13 while frequency band is selected for use by the variable capacitors C1 to C3 and the inductors Ls1, Ls2. The signal amplified by the field effect transistors M11 to M13 is outputted from the output terminal To, as the output signal So. A direct-current component of the amplified signal is cut off from the signal by the capacitor Ct.

Because the second embodiment changes the inductances of the inductors Ls1, Ls2 by controlling the on/off of each of the field effect transistors M11 to M13, it makes it possible to tune the amplifier in order that the amplifier can operate in good condition in multiple frequency bands while suppressing change in gain.

In the embodiment shown in FIG. 3, the sources of the respective two field effect transistors M11, M12 are connected to the inductor Ls1. For the purpose of more finely increasing and decreasing the current which flows in the inductor Ls1, the number of field effect transistors connected to the inductors Ls1, Ls2 may be increased.

Figure 4A:
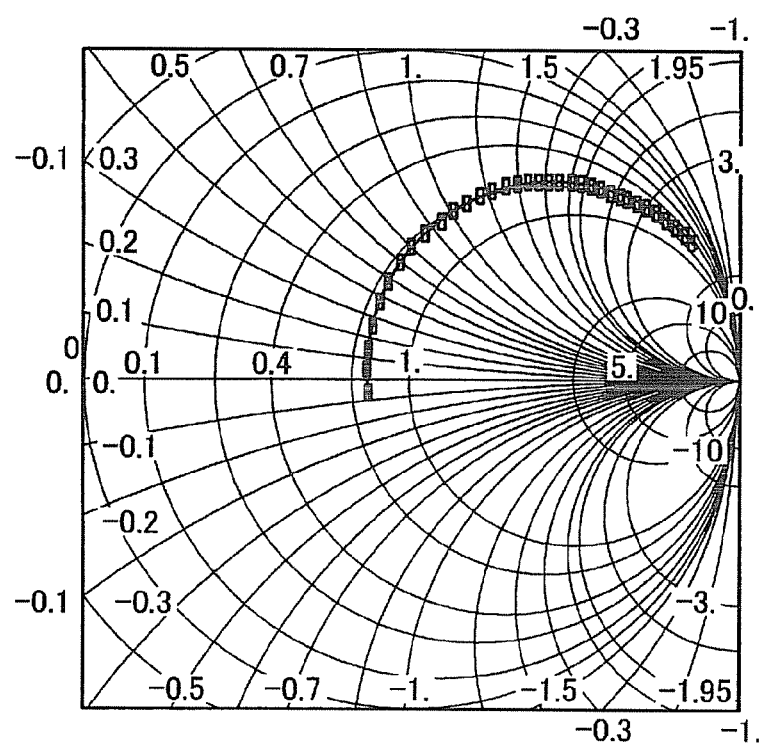
FIGS. 4A and 4B are Smith charts showing loci of impedances observed when values of inductors and variable capacitors shown in FIG. 3 are changed.
Figure 4B:
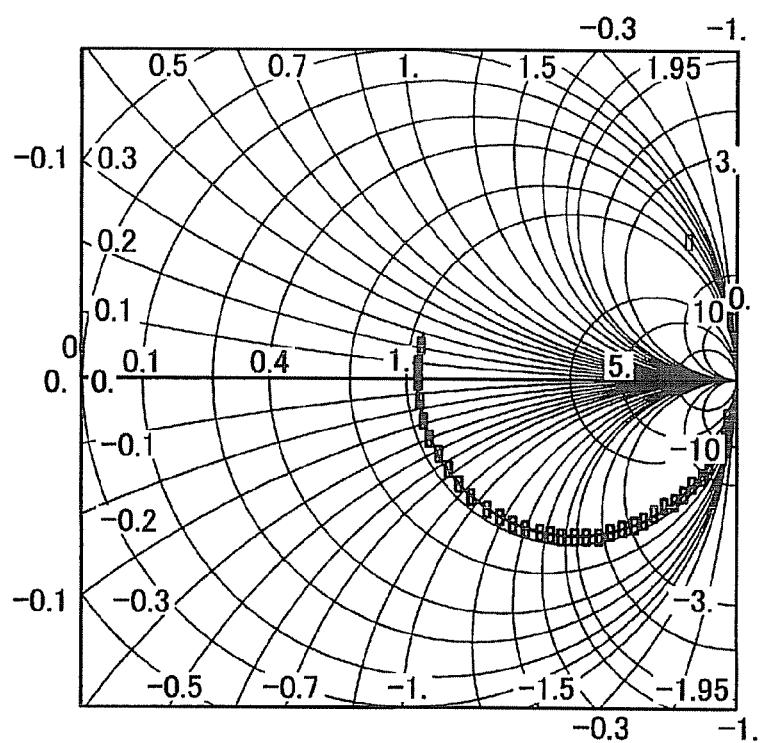

FIGS. 4A and 4B are Smith charts which show loci of impedances observed when values of inductors Ls1, Ls2 shown in FIG. 3 are changed.

FIG. 4A shows impedance observed when the amplifier shown in FIG. 3 is matched with an input signal whose frequency is 500 MHz, under the following conditions. The values of the respective inductors Ls1, Ls2 are set to 6 nH. The mutual inductance Mb is set to 0.7. The value of the inductor Lx is set to 50 nH. The values of the variable capacitors C1 to C3 are set to 600 fF. The field effect transistors M11, M12 are turned on. Further, the field effect transistor M13 is turned off. The sum of the drain currents of the field effect transistors M11 to M13 becomes equal to approximately 2.4 mA.

Because the field effect transistors M11, M12 are on and the field effect transistors M13 is off, a current is provided to the inductor Ls1 through the field effect transistors M11, M12, but no current is provided to the inductor Ls2.

Accordingly, only the inductor Ls1 functions as a degeneration inductor, while the inductor Ls2 does not function as a degeneration inductor. It is seen that impedance matching can be achieved for the input signal having a frequency of 500 MHz when the values of the respective variable capacitors C1 to C3 are set adequately. It is because the imaginary part of the input impedance becomes equal to 0 (zero) and the real part of the input impedance becomes equal to approximately 50Ω.

FIG. 4B shows impedance observed when the amplifier shown in FIG. 3 is matched with an input signal having a frequency of 1 GHz, under the following conditions. The values of the respective inductors Ls1, Ls2 are set to 6 nH. The mutual inductance Mb is set to 0.7. The value of the inductor Lx is set to 50 nH. The values of the variable capacitors C1 to C3 are set to 50 fF. The field effect transistors M11, M13 are turned on. The field effect transistor M12 is turned off. In this case, the sum of the drain currents of the field effect transistors M11 to M13 becomes equal to approximately 2.4 mA.

In this case, a current is provided to the inductor Ls1 through the field effect transistor M11, and another current is provided to the inductor Ls2 through the field effect transistor M13. As a result, the magnetic fluxes of the respective inductors Ls1, Ls2 weaken each other. Accordingly, the inductances of the respective inductors Ls1, Ls2 decrease, as a whole. Thus, the inductors Ls1, Ls2 function as degeneration inductors having small values, as a whole.

Furthermore, because the inductors Ls1, Ls2 are connected in parallel almost equivalently, the effective inductance of each inductor is reduced to a half. It is seen that the impedance matching can be achieved for the input signal having a frequency of 1 GHz. It is because the imaginary part of the input impedance becomes equal to 0 (zero) and the real part of the input impedance becomes equal to approximately 50Ω.

Figure 5:
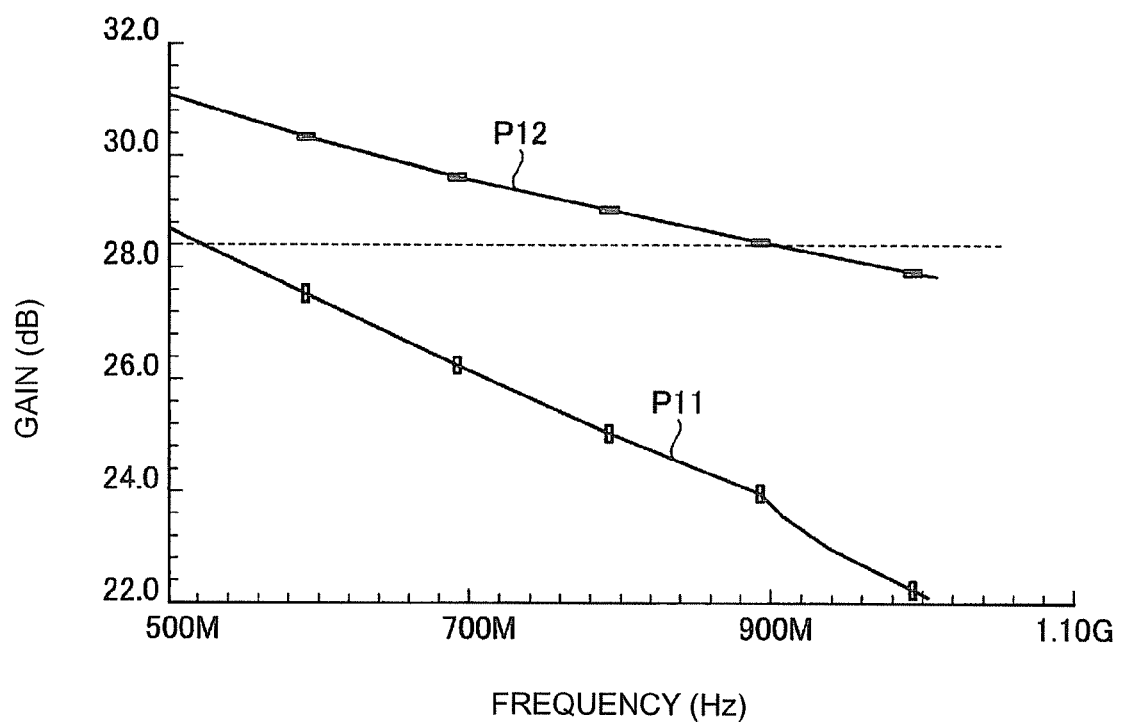
FIG. 5 is a diagram showing characteristics of maximum available gain with respect to frequency, which are observed when the values of the inductors and the variable capacitors shown in FIG. 3 are changed.

FIG. 5 is a diagram showing how the characteristics of maximum available gain depend on frequency when the values of the inductors Ls1, Ls2 provided in the amplifier shown in FIG. 3 are changed. A line P11 represents the dependency which is observed when the amplifier shown in FIG. 3 is matched with the input signal having a frequency of 500 MHz. A line P12 represents the dependency, which is observed when the amplifier shown in FIG. 3 is matched with the input signal having a frequency of 1 GHz.

As shown in FIG. 5, when the amplifier shown in FIG. 3 is matched with the input signal having a frequency of 500 MHz, the gain at 500 MHz is 28.8 dB. When the amplifier shown in FIG. 3 is matched with the input signal having a frequency of 1 GHz, the gain at 1 GHz is 28.8 dB. Thus, even when the selected frequency is changed from 500 MHz to 1 GHz, the gain at 500 MHz and the gain at 1 GHz can be almost equal to each other.

Figure 6:
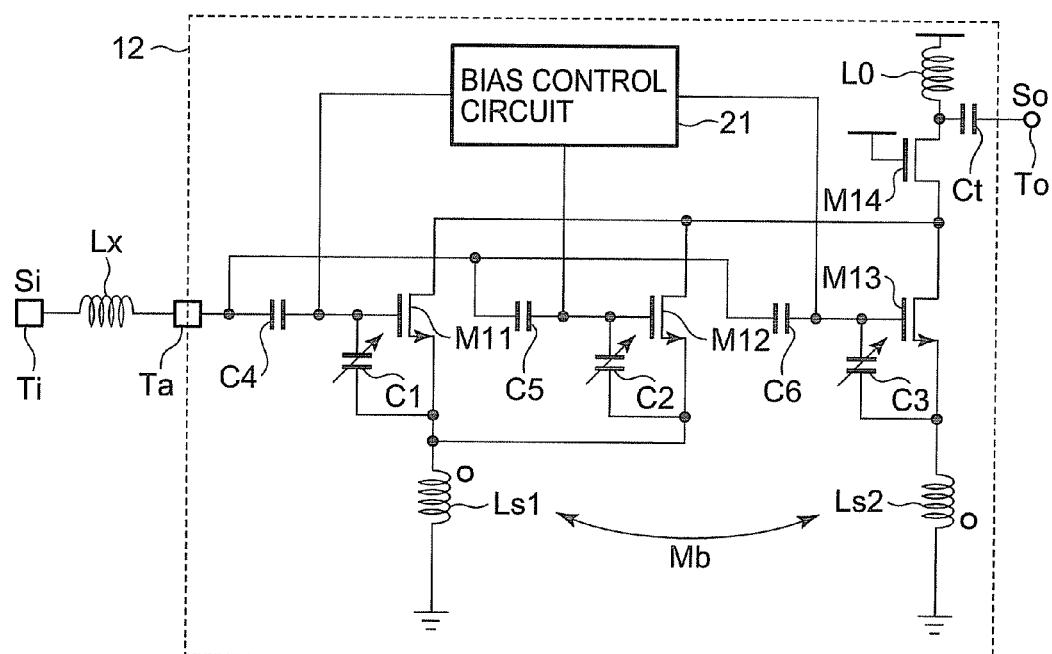
FIG. 6 is a circuit diagram showing a schematic configuration of an amplifier according to a third embodiment of the invention.

FIG. 6 is a circuit diagram showing a schematic configuration of an amplifier according to a third embodiment of the invention.

The amplifier is provided with a bias controlling circuit 21 instead of the On/OFF control circuit 11 shown in FIG. 3. The bias controlling circuit 21 is connected to the gates of respective field effect transistors M11 to M13 each to amplify the high-frequency signal.

The bias controlling circuit 21 controls the gate potentials of the respective field effect transistors M11 to M13 individually. Thus, the bias controlling circuit 21 is capable of controlling currents individually which flow in inductors Ls1, Ls2 respectively. The bias controlling circuit 21 can individually control the currents which flow in the inductors Ls1, Ls2 respectively, in order to achieve impedance matching at a selected frequency.

An input signal Si, which is inputted through an inductor Lx, is inputted into the gates of the field effect transistors M11 to M13 respectively through capacitors C4 to C6. The bias controlling circuit 21 controls the gate potentials of the respective field effect transistors M11 to M13 individually according to each selected frequency. Thus, the bias controlling circuit 21 controls the currents which flow in the inductors Ls1, Ls2 respectively, Accordingly, the bias controlling circuit 21 changes the inductances of the respective inductors Ls1, Ls2.

The input signal Si is amplified by the field electric transistors M11 to M13 while frequency band is selected for use by the variable capacitors C1 to C3 and the inductors Ls1, Ls2. The signal amplified by the field effect transistors M11 to M13 is outputted, as the output signal So. A direct-current component of the amplified signal is cut off by the capacitor Ct.

The third embodiment can continuously change the inductances of the respective inductors Ls1, Ls2 by controlling the biases of the respective field effect transistors M11 to M13. In addition, the third embodiment makes it possible to tune the amplifier in order that the amplifier can operate in multiple frequency bands while inhibiting increase in the number of field effect transistors.

Figure 7:
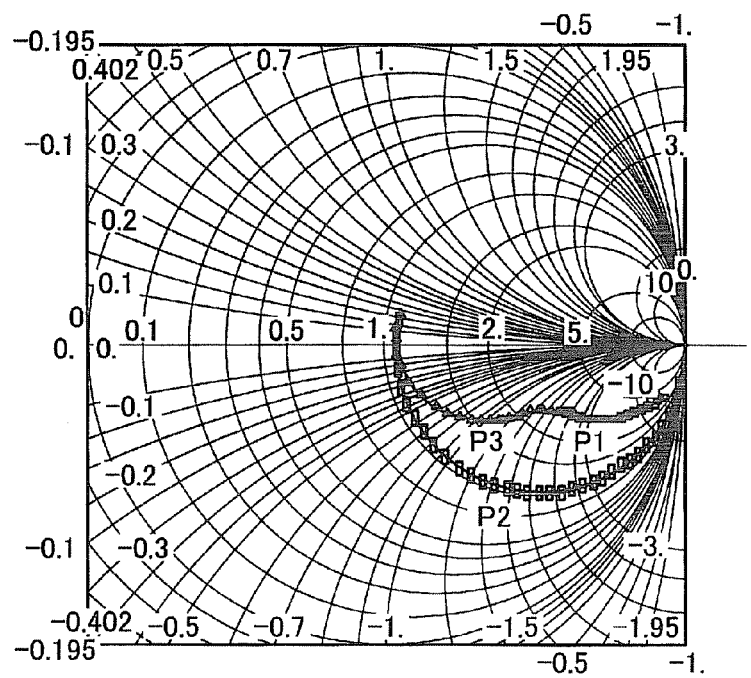
FIG. 7 is a diagram showing a characteristic of input impedance with respect to frequency, which is observed when the values of the inductors and the variable capacitors shown in FIG. 6 and values of bias currents of field effect transistors shown in FIG. 6 are changed.

FIG. 7 is a diagram showing characteristics of input impedance with respect to frequency observed when the values of the inductors Ls1, Ls2 shown in FIG. 6 are changed. A curve P1 represents a characteristic of input impedance with respect to frequency observed when values of the degeneration inductors in the amplifier shown in FIG. 6 are set to large values. A curve P2 represents a characteristic of input impedance with respect to frequency observed when the values of the degeneration inductors in the same amplifier are set to small values. A curve P3 represents a characteristic of input impedance with respect to frequency observed when the biases of the respective field effect transistors M12, M13 are continuously changed. It is seen that the real part of the impedance continuously changes when the bias currents of the respective field effect transistors M12, M13 are continuously changed.

With reference to FIG. 7, behavior of impedance change will be described in detail for the case where the biases of the respective field effect transistors M12, M13 shown in FIG. 6 are continuously changed. For instance, it is assumed that the values of the inductors Ls1, Ls2 are 6 nH, the mutual inductance Mb is 0.7, the value of the inductor Lx is 50 nH and that the values of the variable capacitors C1 to C3 are 50 fF. In addition, it is assumed that the field effect transistor M11 is on, the gate voltage of the field effect transistor M12 is expressed with Vgs/2+ΔVgs and that the gate voltage of the field effect transistor M13 is expressed with Vgs/2−ΔVgs. In this respect, Vgs denotes a predetermined voltage between the gate and source of each of the field effect transistors. ΔVgs is changed in a range of −Vgs/2 to +Vgs/2. The sum of the drain currents of the field effect transistors M11 to M13 becomes equal to approximately 2.4 mA. At this time, as the biases of the respective field effect transistors M12, M13 are continuously changed, the real part of the input impedance continuously changes along the curve P3 of FIG. 7. This shows that the effective values of the degeneration inductors continuously change.

In the embodiments, N-channel field effect transistors are employed as the transistors. Instead, P-channel field effect transistors may be used. Even bi-polar transistors may be used. When bi-polar transistors are used, the gates of the field effect transistors are replaced with the bases of the bi-polar transistors, the sources of the field effect transistors are replaced with the emitters of the bi-polar transistors, and the drains of the field effect transistors are replaced with the collectors of the bi-polar transistors.

Figure 8:
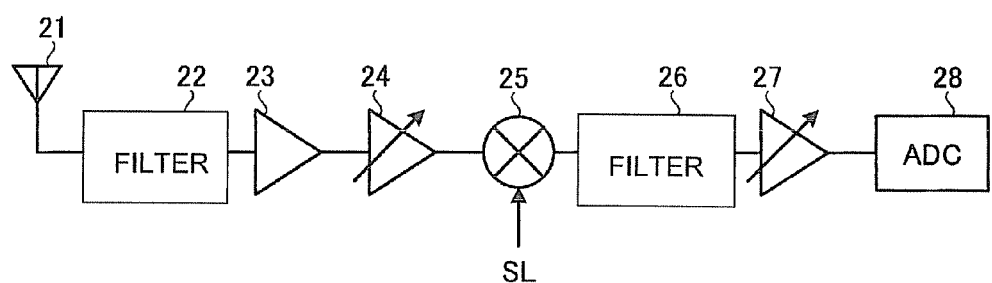
FIG. 8 is a block diagram showing a schematic configuration of an example of a communication system having an amplifier.

FIG. 8 is a block diagram showing an example of a communication system.

The communication system is provided with a reception antenna 21, a filter 22, a low-noise amplifier 23, a variable gain amplifier 24, a mixer 25, a filter 26, a variable gain amplifier 27, and an A/D (analog-to-digital) converter 28. These units are connected in series, one after another. In order to amplify a high-frequency signal, an amplifier as that shown in FIG. 1, FIG. 3 or FIG. 6 may be used as the low-noise amplifier 23.

The filter circuit 22 selects a desired frequency component from a radio-frequency signal which is received by the reception antenna 21. The selected signal is amplified by the low-noise amplifier 23, and the gain of the amplified signal is subsequently adjusted by the variable gain amplifier 24. Then, the resultant signal is inputted into the mixer 25. The signal outputted from the variable gain amplifier 24 is mixed with a local oscillation signal SL, in the mixer 25. Down conversion based on the mixture generates a baseband signal.

The filter circuit 26 removes unnecessary frequency components from the baseband signal generated by the mixer 25. The gain of the signal outputted from the filter 26 is adjusted by the variable gain amplifier 27. Subsequently, the resultant signal is converted to a digital signal by the A/D converter 28.

The communication system shown in FIG. 8 is applicable to a terrestrial digital broadcast receiver, for instance, using a frequency band of 470 MHz to 770 MHz in the UHF band. A total of 50 channels from the 13th channel to the 62nd channel are assigned to the terrestrial digital broadcast. A frequency band of 6 MHz is assigned to each of the channels. When the amplifier shown in any one of FIG. 1, FIG. 3 or FIG. 6 is used as the low-noise amplifier 23, the communication system can be tuned in order to operate in good condition in all the frequency bands covering the 50 channels while suppressing change in gain.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. An amplifier comprising:
   a transistor to amplify a high frequency signal, a gate/base of the transistor receiving the high frequency input signal;
   a variable capacitor connected between the gate and a source/between the base and an emitter of the transistor; and
   a variable inductor connected with the source/the emitter of the transistor.

2. An amplifier according to claim 1, wherein the values of the variable capacitor and the variable inductor are set so as to obtain impedance matching at a selected frequency.

3. An amplifier according to claim 1, further comprising an inductor connected with the gate/base of the transistor.

4. An amplifier according to claim 1, further comprising a capacitor connected with a drain/collector of the transistor.

5. An amplifier having a high frequency signal input terminal and a high frequency signal output terminal, comprising:
   a plurality of transistors to amplify a high frequency signal, gates/bases of the transistors being connected with the high frequency signal input terminal, drains/collectors of the transistors being connected with the high frequency signal output terminal;
   a plurality of variable capacitors connected between the gates and sources/between the bases and emitters of the transistors respectively;
   a plurality inductors connected with the sources/the emitters of the transistors and mutually coupled with each other electromagnetically; and
   an On/OFF control circuit to control the potentials of the gates/the bases of the transistors respectively, the On/OFF control circuit turns on/off the transistors selectively.

6. An amplifier according to claim 5, wherein the On/OFF control circuit performs On/OFF control so as to obtain impedance matching at a selected frequency.

7. An amplifier according to claim 5, wherein
   the sources/the emitters of a plurality of the transistors are connected with one of the inductors commonly, and the On/OFF control circuit change the number of the transistors to be turned on so as to control current flowing through the one of the inductors.

8. An amplifier according to claim 5, further comprising a capacitor connected between the gate/base of the transistor and the high frequency signal input terminal.

9. An amplifier according to claim 5, further comprising a capacitor connected with the drains/collectors of the transistors.

10. An amplifier according to claim 5, further comprising an inductor connected with the high frequency signal input terminal.

11. An amplifier having a high frequency signal input terminal and a high frequency signal output terminal, comprising:
- a plurality of transistors to amplify a high frequency signal, gates/bases of the transistors being connected with the high frequency signal input terminal, drains/collectors of the transistors being connected with the high frequency signal output terminal;
- a plurality of variable capacitors connected between the gates and sources/between the bases and emitters of the transistors respectively;
- a plurality inductors connected with the sources/the emitters of the transistors and mutually coupled with each other electromagnetically; and
- a bias control circuit to control the bias potentials of the gates/the bases of the transistors respectively, the bias control circuit regulate currents flowing through the transistors respectively.

12. An amplifier according to claim 11, wherein the bias control circuit controls currents flowing through the inductors so as to obtain impedance matching at a selected frequency.

13. An amplifier according to claim 11, further comprising capacitors connected between the gates/bases of the transistors and the high frequency signal input terminal.

14. An amplifier according to claim 11, further comprising a capacitor connected with the drains/collectors of the transistors.

15. An amplifier according to claim 11, further comprising an inductor connected with the high frequency signal input terminal.

* * * * *